(12) United States Patent
Jeong

(10) Patent No.: US 7,257,726 B2
(45) Date of Patent: Aug. 14, 2007

(54) CIRCUIT FOR GENERATING WAIT SIGNAL IN SEMICONDUCTOR DEVICE

(75) Inventor: Duk Ju Jeong, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 423 days.

(21) Appl. No.: 10/879,446

(22) Filed: Jun. 29, 2004

(65) Prior Publication Data

US 2005/0235175 A1   Oct. 20, 2005

(30) Foreign Application Priority Data

Apr. 20, 2004   (KR) .................... 10-2004-0027095

(51) Int. Cl.
   *G06F 1/00*   (2006.01)
(52) U.S. Cl. .................. 713/500; 713/501; 713/502
(58) Field of Classification Search ................ 713/500, 713/501, 502
   See application file for complete search history.

(56) References Cited

U.S. PATENT DOCUMENTS

| | | | |
|---|---|---|---|
| 5,572,706 A * | 11/1996 | Matsumoto | 711/167 |
| 6,549,477 B1 * | 4/2003 | Bautista et al. | 365/194 |
| 6,611,796 B1 * | 8/2003 | Natarajan et al. | 703/28 |
| 6,857,035 B1 * | 2/2005 | Pritchard et al. | 710/110 |
| 6,915,406 B2 * | 7/2005 | Chiba et al. | 711/207 |
| 2002/0035654 A1 * | 3/2002 | Mori et al. | 710/36 |

* cited by examiner

*Primary Examiner*—Thomas Lee
*Assistant Examiner*—Malcolm Cribbs
(74) *Attorney, Agent, or Firm*—Marshall, Gerstein & Borun LLP

(57) ABSTRACT

The present invention discloses a circuit for generating a wait signal in a semiconductor device. Even if an address input enable signal is synchronized with a clock and continuously or irregularly inputted, the circuit for generating the wait signal in the semiconductor device generates the wait signal suitable for a latency counter by using the finally-inputted address input enable signal. In addition, the circuit for generating the wait signal in the semiconductor device generates the wait signals having various pulse widths to be suitable for various latency counters, and enables the object wait signal earlier than data input or output by one clock, or simultaneously with data input or output.

15 Claims, 7 Drawing Sheets

CIRCUIT FOR GENERATING WAIT SIGNAL IN SEMICONDUCTOR DEVICE

This application relies for priority upon Korean Patent Application No. 2004-0027095 filed on Apr. 20, 2004, the contents of which are herein incorporated by reference in their entirety.

BACKGROUND

1. Field of the Invention

The present invention relates to a circuit for generating a wait signal in a semiconductor device, and more particularly to, a circuit for generating a wait signal which can generate the wait signal in every data input or output state of a synchronous pseudo SRAM.

2. Discussion of Related Art

FIG. 1 is a waveform diagram showing a data input or output operation of a general semiconductor device.

Referring to FIG. 1, when a chip select signal /CS is logic low and a clock CLK rises, if an address input enable signal /ADV is logic low, an external address ADD and a write enable signal /WE are inputted. FIG. 1 is a timing diagram when a latency counter is 4. The latency counter defines a clock number for data input or output after an external address is inputted. In FIG. 1, an external address A0 is inputted and a data D0 is written in the fourth clock, and an external address A1 is inputted and a data Q0 is read in the fourth clock.

When a first address input enable signal /ADV is logic low, the address A0 and the write enable signal /WE are inputted, to perform the write operation. Here, a wait signal WAIT is enabled earlier than input time points of data D0, D1, D2 and D3 by one clock. In addition, when the clock CLK rises and the address input enable signal /ADV is logic high, a burst mode is internally executed. The burst mode is maintained by using an address inputted when the address input enable signal /ADV is logic low as a seed address. In the burst mode, the address is internally increased by one by using the seed address as a start address, thereby continuously performing the read or write operation.

When a second address input enable signal /ADV is low, the address A1 and a write enable bar signal become logic high, to perform the read operation. Here, the wait signal WAIT is enabled earlier than output time points of read data Q0, Q1, Q2 and Q3 by one clock.

In general, the wait signal WAIT maintains a high impedance level when the chip select signal /CS is logic high (standby state), is logic low when the chip select signal /CS is logic low, and is high when the clock CLK is inputted and the data is inputted or outputted.

In the conventional arts, a circuit for always generating a wait signal WAIT after three clocks from input of a low address input enable signal /ADV has been employed. However, when the clock CLK rises, if the low address input enable signal /ADV is continuously inputted, the wait signal WAIT maintains logic high after three clocks. That is, when the wait signal WAIT is enabled after three clocks from input of the address input enable signal /ADV, malfunction occurs during the operation.

SUMMARY OF THE INVENTION

The present invention is directed to a circuit for generating a wait signal in a semiconductor device which can generate the wait signal before one clock from data input or output, even if an address input enable signal is inputted continuously or at a predetermined clock interval.

One aspect of the present invention is to provide a circuit for generating a wait signal in a semiconductor device, including: a latch unit for sequentially generating a plurality of latch signals by shifting an address input enable signal in every clock; a wait signal generating unit for generating a plurality of wait signals corresponding to latency counter values according to the plurality of latch signals; a wait signal selecting and transmitting unit for outputting the wait signal corresponding to the target latency counter value among the plurality of wait signals according to a plurality of latency counter signals and a wait output control signal; and an output unit for determining a logic state of the wait signal and outputting the wait signal according to an output state control signal and a chip select signal.

Preferably, the latch unit includes: a first shift latch unit driven by a power-up signal, for transmitting a first latch signal synchronized with a clock and a first output signal according to the address input enable signal and the clock signal; a second shift latch unit for transmitting a second latch signal obtained by shifting the first latch signal and a second output signal according to the power-up signal, the first output signal and the clock signal; a third shift latch unit for transmitting a third latch signal obtained by shifting the second latch signal and a third output signal according to the power-up signal, the second output signal and the clock signal; a fourth shift latch unit for transmitting a fourth latch signal obtained by shifting the third latch signal and a fourth output signal according to the power-up signal, the third output signal and the clock signal; a fifth shift latch unit for transmitting a fifth latch signal obtained by shifting the fourth latch signal and a fifth output signal according to the power-up signal, the fourth output signal and the clock signal; a sixth shift latch unit for transmitting a sixth latch signal obtained by shifting the fifth latch signal and a sixth output signal according to the power-up signal, the fifth output signal and the clock signal; and a seventh shift latch unit for transmitting a seventh latch signal obtained by shifting the sixth latch signal and a seventh output signal according to the power-up signal, the sixth output signal and the clock signal.

Preferably, the wait signal generating unit includes: a first wait signal logic combination unit for generating a first wait signal maintaining a predetermined logic state for a smaller clock than a minimum latency counter by one clock by logic combination of the latch signals; a second wait signal logic combination unit for generating a second wait signal maintaining a predetermined logic state longer than the first wait signal by one clock by logic combination of the latch signals; a third wait signal logic combination unit for generating a third wait signal maintaining a predetermined logic state longer than the second wait signal by one clock by logic combination of the latch signals; and a fourth wait signal logic combination unit for generating a fourth wait signal maintaining a predetermined logic state longer than the third wait signal by one clock by logic combination of the latch signals.

Preferably, the wait signal selecting and transmitting unit includes: a latency counter selecting unit for generating a select signal for selecting the wait signal corresponding to the target latency counter according to the plurality of latency counter signals and the wait output control signal for determining the target latency counter and the enable time of the wait signal; and a transmission control unit for transmitting the wait signal corresponding to the target latency counter according to the select signal.

Preferably, the latency counter selecting unit includes first to fourth select signal output units for transmitting a plurality of select signals for selecting the wait signal corresponding to the target latency counter according to the wait output control signal and the first to fourth latency counter signals, and determining whether to enable the wait signal simultaneously with data input or output, or before one clock from data input or output.

Preferably, the output unit includes a first output transmitting unit for transmitting the wait signal or an inverted signal of the wait signal according to the output state control signal for determining whether to enable the wait signal to logic high or logic low in the data input or output state; and a second output transmitting unit for determining a logic state of the wait signal and outputting the wait signal according to the output from the first output transmitting unit and the chip select signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
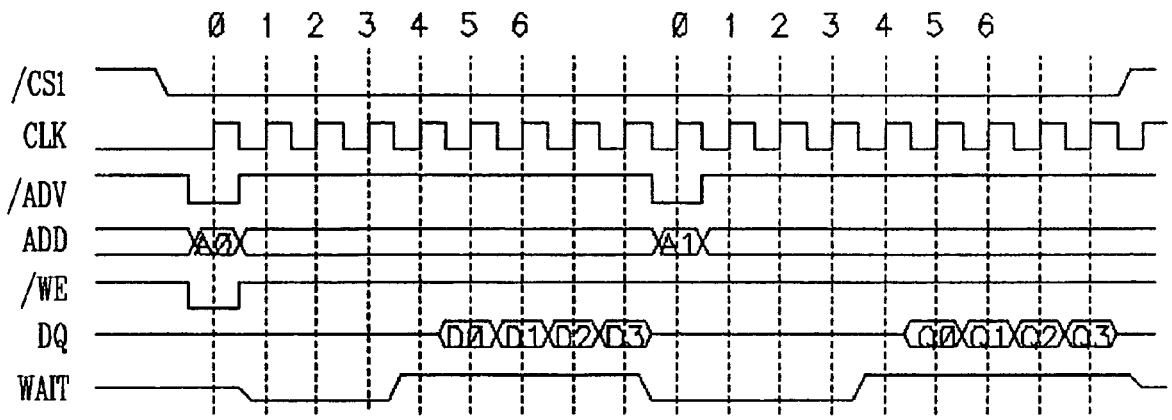
FIG. 1 is a waveform diagram showing a data input or output operation of a conventional semiconductor device.

A circuit for generating a wait signal in a semiconductor device in accordance with a preferred embodiment of the present invention will now be described in detail with reference to the accompanying drawings. Wherever possible, the same reference numerals will be used throughout the drawings and the description to refer to the same or like parts.

Figure 2:
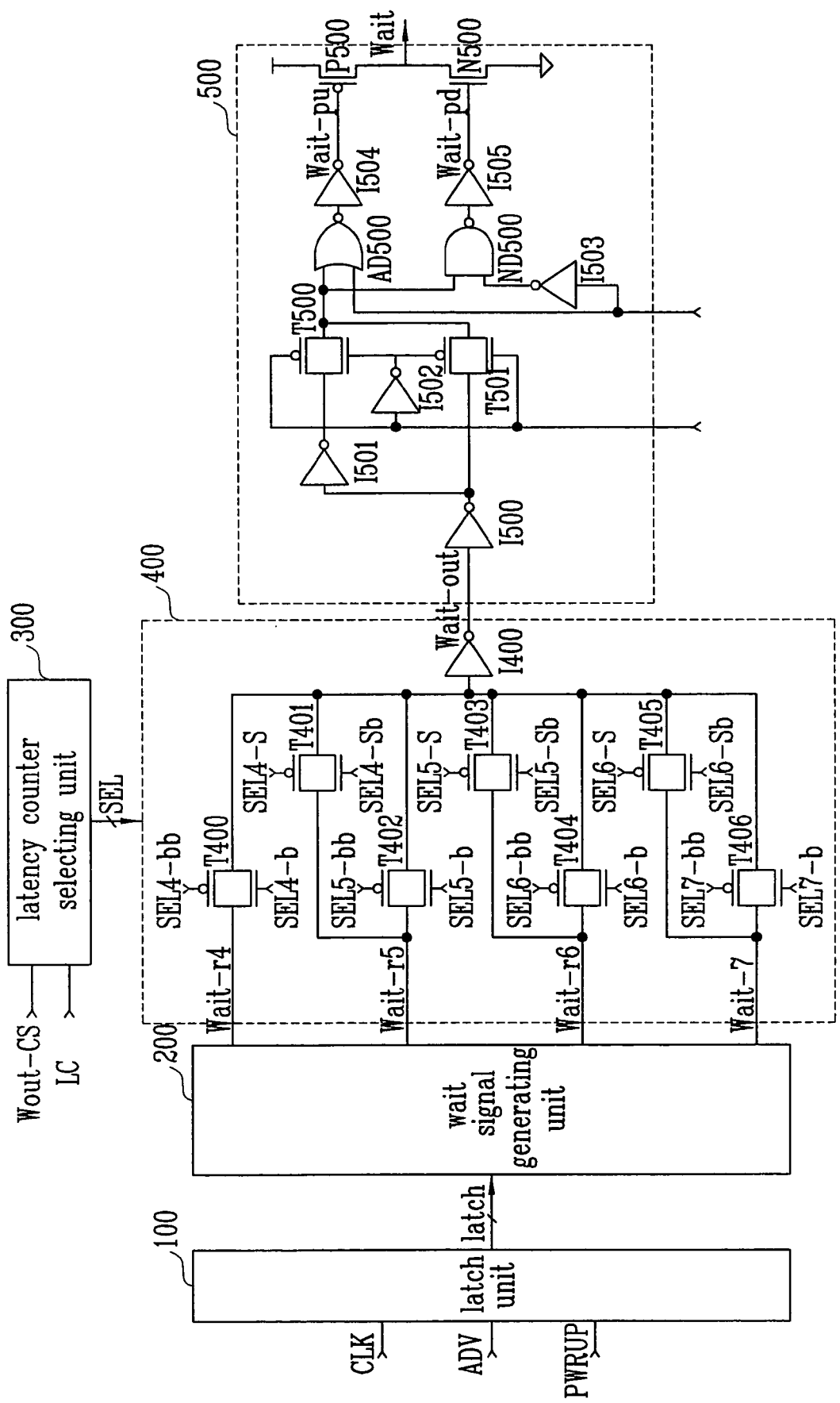
FIG. 2 is a circuit diagram illustrating a circuit for generating a wait signal in a semiconductor device in accordance with the present invention.

FIG. 2 is a circuit diagram illustrating the circuit for generating the wait signal in the semiconductor device in accordance with the present invention.

As illustrated in FIG. 2, the circuit for generating the wait signal includes a latch unit 100 for sequentially generating a plurality of latch signals latch<0:6> by synchronizing an address input enable signal ADV with a clock, and shifting the address input enable signal ADV in every clock, a wait signal generating unit 200 for generating a plurality of wait signals Wait-r4 to Wait-r7 corresponding to latency counters according to the plurality of latch signals latch<0:6>, a wait signal selecting and transmitting unit 300 and 400 for outputting the wait signal Wait-out corresponding to the latency counter of the device among the plurality of wait signals Wait-r4 to Wait-r7 according to a plurality of latency counter signals LC4 to LC7 and a wait output control signal Wout-CS, and an output unit 500 for determining a logic state of the wait signal Wait and outputting the wait signal Wait according to an output state control signal Wctl and a chip select signal /CS.

The wait signal selecting and transmitting unit 300 and 400 includes a latency counter selecting unit 300 for generating a select signal SEL for selecting the wait signal Wait-r4 to Wait-r7 corresponding to the latency counter according to the plurality of latency counter signals LC4 to LC7 and the wait output control signal Wout-CS for determining the target latency counter and the enable time of the wait signal Wait, and a transmission control unit 400 for transmitting the wait signal Wait-out corresponding to the target latency counter according to the select signal SEL. Preferably, the latch unit 100 is driven according to a power-up signal PWRUP. A sign of ADV denotes an inverted signal of the address input enable signal.

Figure 3:
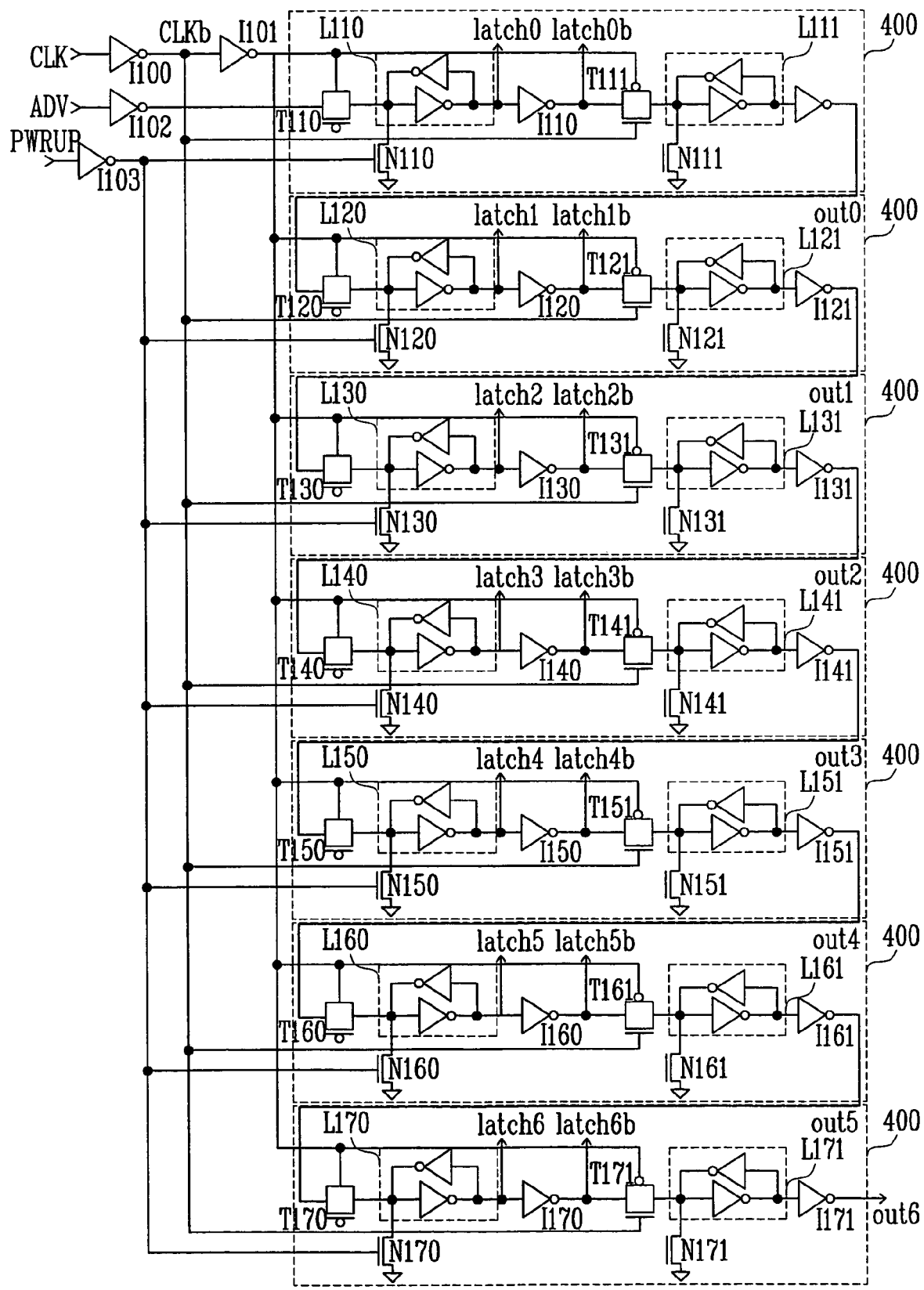
FIG. 3 is a circuit diagram illustrating a latch unit of FIG. 2.

FIG. 3 is a circuit diagram illustrating the latch unit of FIG. 2.

As shown in FIGS. 2 and 3, the latch unit 100 includes a plurality of shift latch units 110 to 170 each respectively driven by the power-up signal PWRUP, for receiving the address input enable signal ADV or the output from the preceding terminal, latching the signal according to the clock, outputting a predetermined latch signal latch0 to latch 6, shifting the latch signal latch0 to latch6, and outputting the shifted signal. The latch unit 100 further includes a 100-th inverter I100 for inverting the clock signal CLK, and a 101-th inverter I101 for re-inverting the inverted clock signal CLKb. In addition, the latch unit 100 further includes a 102-th inverter I102 for inverting the address input enable signal ADV, and a 103-th inverter I103 for inverting the power-up signal PWRUP. The plurality of shift latch units 110 to 170 include a first shift latch unit 110 for transmitting a first latch signal latch0 and a first output signal out1 according to the clock signal CLK, the address input enable signal ADV and the power-up signal PWRUP, and second to seventh shift latch units 120 to 127 for transmitting second to seventh latch signals latch1 to latch6 and second to seventh output signals out1 to out6 according to the clock signal CLK, the power-up signal PWRUP and the output signal from the preceding terminal.

The first to seventh shift latch units 110 to 170 include a 110-th transmission gate T110 for transmitting the inverted address input enable signal ADV or the first to sixth output signals out0 to out5 according to the clock signal CLK, a 110-th latch L110 for outputting the latch signals latch0 to latch6 by latching the outputs from the 110-th transmission gate T110, a 110-th inverter I110 for inverting the latch signals latch0 to latch6, and transmitting the inverted latch signals latch0b to latch6b, a 111-th transmission gate T111 for transmitting the inverted latch signals latch0b to latch6b according to the clock signal CLK, a 111-th latch L111 for latching the outputs from the 111-th transmission gate T111, and a 111-th inverter I111 for inverting the outputs from the 111-th latch L111, and transmitting the first to seventh output signals out0 to out6. Preferably, the 110-th transmission gate T110 is operated in the rising edge of the clock, and the 111-th transmission gate T111 is operated in the falling edge of the clock. The first to seventh shift latch units 110 to 170 further include 110-th and 111-th NMOS transistors N110 and N111 for initializing the 110-th and 111-th latches L110 and L111 according to the inverted power-up signal, respectively. Preferably, the address input enable signal ADV applied to the first to fourth shift latch units 110 to 170 has the same phase as the clock. Preferably, a signal applied through a clock buffer unit is used as the clock signal CLK.

Figure 4:
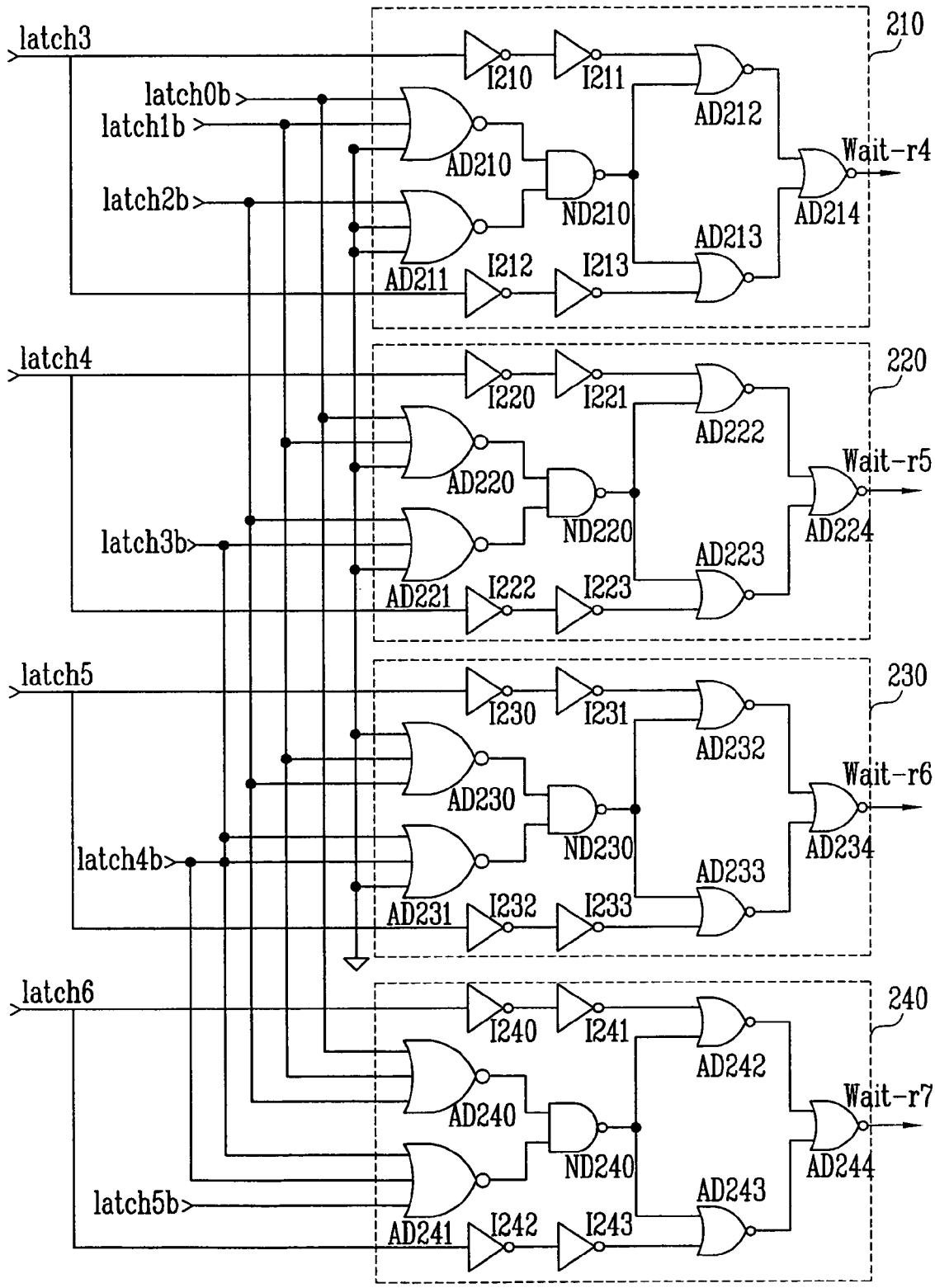
FIG. 4 is a circuit diagram illustrating a wait signal generating unit of FIG. 1.

FIG. 4 is a circuit diagram illustrating the wait signal generating unit of FIG. 1.

As depicted in FIGS. 1 to 4, the wait signal generating unit 200 includes a first wait signal logic combination unit 210 for generating the first wait signal Wait-r4 by logic combination of the fourth latch signal latch3 and the inverted first to third latch signals latch0b to latch2b, a second wait signal logic combination unit 220 for generating the second wait signal Wait-r5 by logic combination of the fifth latch signal latch4 and the inverted first to fourth latch signals latch0b to latch3b, a third wait signal logic combination unit 230 for generating the third wait signal Wait-r6 by logic combination of the sixth latch signal latch5 and the inverted first to fifth latch signals latch0b to latch4b, and a fourth wait signal logic combination unit 240 for generating the fourth wait signal Wait-r7 by logic combination of the seventh latch signal latch6 and the inverted first to sixth latch signals latch0b to latch5b. The first wait signal Wait-r4 maintains a predetermined logic level for three clocks, the second wait signal Wait-r5 maintains a predetermined logic level for four clocks, the third wait signal Wait-r6 maintains a predetermined logic level for five clocks, and the fourth wait signal Wait-r7 maintains a predetermined logic level for six clocks.

The first to fourth wait signal logic combination units 210 to 240 include a 210-th NOR gate AD210 for receiving and logically NORing first to third input signals, a 211-th NOR gate AD211 for receiving and logically NORing fourth to sixth input signals, a 210-th NAND gate ND210 for receiving the outputs from the 210-th and 211-th NOR gates AD210 and AD211, and logically NANDing the signals, a 212-th NOR gate AD212 for receiving a seventh input signal and the output from the 210-th NAND gate ND210 and logically NORing the signals, a 213-th NOR gate AD213 for receiving the seventh input signal and the output from the 210-th NAND gate ND210, and logically NORing the signal, and a 214-th NOR gate AD214 for logically NORing the outputs from the 212-th and 213-th NOR gates AD212 and AD213, and outputting the wait signals Wait-r4 to Wait-r7. The first to fourth wait signal logic combination units 210 to 240 further include 210-th and 211-th inverters I210 and I211 for delaying the seventh input signal for a predetermined time.

Preferably, the first wait signal logic combination unit 210 uses the inverted first and second latch signals latch0b and latch1b as the first and second input signals, the inverted third latch signal latch2b as the fourth input signal, the fourth latch signal latch3 as the seventh input signal, and the logic low signals as the third to sixth input signals. Preferably, the second wait signal logic combination unit 220 uses the inverted first and second latch signals latch0b and latch1b as the first and second input signals, the inverted third and fourth latch signals latch2b and latch3b as the fourth and fifth input signals, the fifth latch signal latch4 as the seventh input signal, and the logic low signals as the third and sixth input signals. Preferably, the third wait signal logic combination unit 230 uses the inverted first to fifth latch signals latch0b and latch4b as the first to fifth input signals, the sixth latch signal latch5 as the seventh input signal, and the logic low signal as the sixth input signal. Preferably, the fourth wait signal logic combination unit 240 uses the inverted first to sixth latch signals latch0b and latch5b as the first to sixth input signals, and the seventh latch signal latch6 as the seventh input signal.

Figure 5:
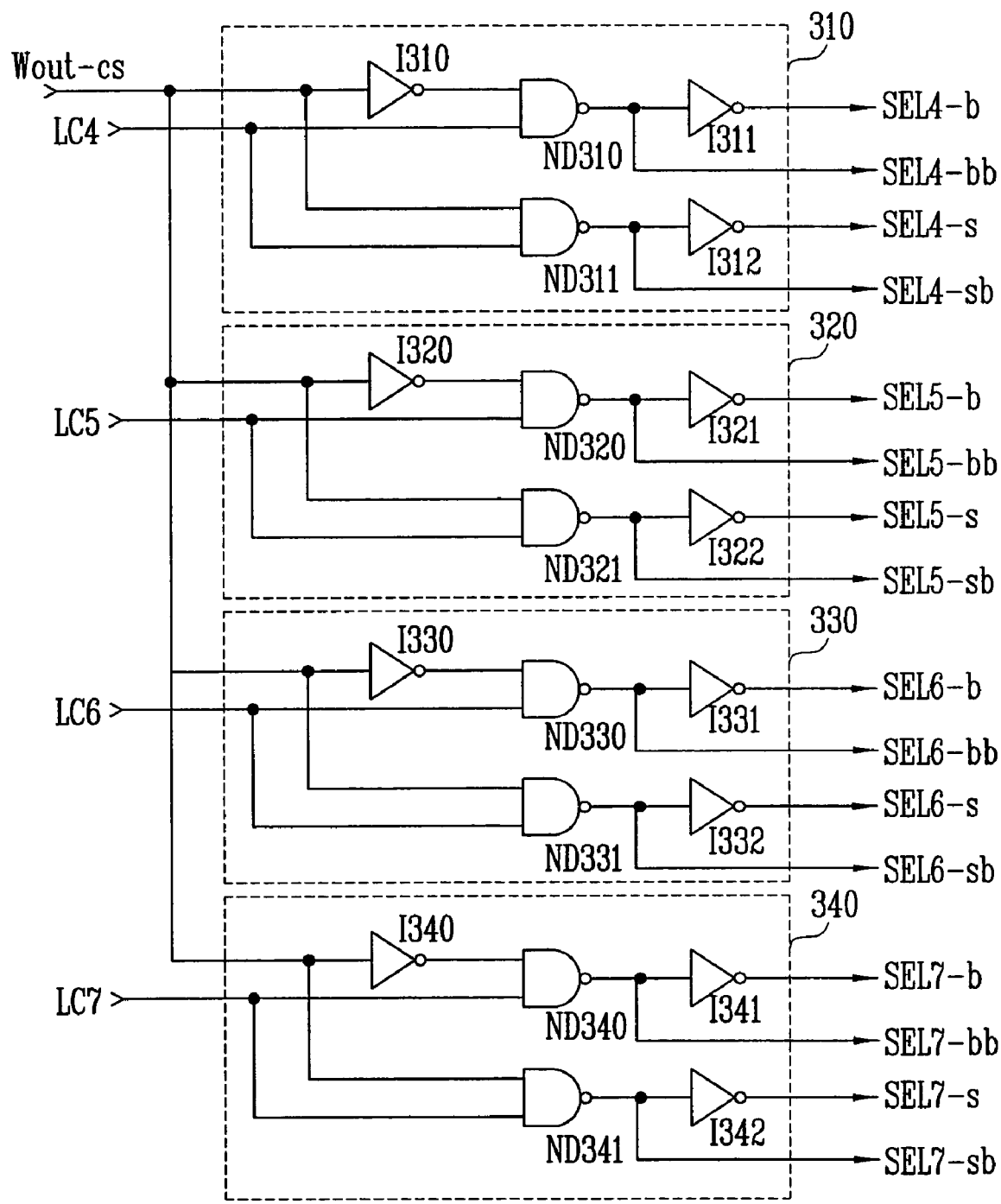
FIG. 5 is a circuit diagram illustrating a latency counter selecting unit of FIG. 1.

FIG. 5 is a circuit diagram illustrating the latency counter selecting unit of FIG. 1.

Referring to FIGS. 1 to 5, the latency counter selecting unit 300 includes first to fourth select signal output units 310 to 340 for transmitting the select signal SEL for selecting the wait signal corresponding to the latency counter of the device according to the wait output control signal Wout-CS and the first to fourth latency counter signals LC4 to LC7, and determining whether to enable the wait signal simultaneously with data input or output, or before one clock from data input or output.

The first to fourth latency counter signals LC4 to LC7 indicate operation mode signals of a chip defined by MRS of the semiconductor device. The first latency counter signal LC4 means that the latency counter is 4, the second latency counter signal LC5 means that the latency counter is 5, the third latency counter signal LC6 means that the latency counter is 6, and the fourth latency counter signal LC7 means that the latency counter is 7. Accordingly, one of the first to fourth latency counter signals LC4 to LC7 is inputted as logic high for the target latency counter. In addition, the wait output control signal Wout-CS defines the enable time of the wait signal. Preferably, when a logic high signal is inputted as the wait output control signal Wout-CS, the wait signal is enabled earlier than data input or output by one clock, and when a logic low signal is inputted as the wait output control signal Wout-CS, the wait signal is enabled simultaneously with data input or output.

The first select signal output unit 310 includes a 310-th NAND gate ND310 for logically NANDing the inverted wait output control signal and the first latency counter signal LC4, a 311-th inverter I311 for inverting the output from the 310-th NAND gate ND310, and transmitting a first previous select signal SEL4-b, a 311-th NAND gate ND311 for logically NANDing the wait output control signal Wout-CS and the first latency counter signal LC4, and a 312-th inverter I312 for inverting the output from the 311-th NAND gate ND311, and transmitting a first same select signal SEL4-s. Preferably, the first select signal output unit 310 further includes a 310-th inverter I310 for inverting the wait output control signal Wout-CS.

The second to fourth select signal output units 320 to 340 have the same circuit structure as that of the first select signal output unit 310. However, the second to fourth select signal output units 320 to 340 receive the second to fourth latency counter signals LC5 to LC7, and output second to fourth previous select signals SEL5-b to SEL7-b and second to fourth same select signals SEL5-s to SEL7-s, respectively.

The first to fourth previous select signals SEL4-b to SEL7-b control the wait signals to be enabled before one clock from data input or output according to each latency counter. The first to fourth same select signals SEL4-s to SEL7-s control the wait signals to be enabled simultaneously with data input or output according to each latency counter. When one of the first to fourth previous select signals SEL4-b to SEL7-b and the first to fourth same select signals SEL4-s to SEL7-s becomes logic high under the input conditions, the other previous select signals and same select signals preferably become logic low.

The transmission control unit and the output unit will now be explained in more detail with reference to FIGS. 2 to 5.

The transmission control unit 400 includes a 400-th transmission gate T400 for transmitting the first wait signal Wait-r4 according to the first previous select signal SEL4-b, 401-th and 402-th transmission gates T401 and T402 for transmitting the second wait signal Wait-r5 according to the first same select signal SEL4-s and the second previous select signal SEL5-b,respectively, 403-th and 404-th transmission gates T403 and T404 for transmitting the third wait signal Wait-r6 according to the second same select signal SEL5-s and the third previous select signal SEL6-b, respectively, and 405-th and 406-th transmission gates T405 and T406 for transmitting the fourth wait signal Wait-r7 according to the third same select signal SEL6-s and the fourth previous select signal SEL7-b, respectively. Preferably, the transmission control unit 400 further includes a 400-th inverter I400 for inverting the outputs from the 400-th to 406-th transmission gates T400 to T406.

The output unit 500 includes a first output transmitting unit for transmitting the wait signal Wait-out which is the output from the transmission control unit 400 or an inverted signal of the wait signal Wait-out according to the output state control signal Wctl, and a second output transmitting unit for determining a logic state of the wait signal Wait and outputting the wait signal Wait according to the output from the first output transmitting unit and the chip select signal /CS. The first output transmitting unit includes a 501-th inverter I501 for inverting the wait signal Wait-out, a 500-th transmission gate T500 for transmitting the inverted wait signal according to the output state control signal Wctl, and a 501-th transmission gate T501 for transmitting the wait signal according to the output state control signal Wctl. The output state control signal Wctl is applied to a gate terminal of a PMOS transistor of the 500-th transmission gate T500, and a gate terminal of an NMOS transistor of the 501-th transmission gate T501, and the inverted output state control signal is applied to a gate terminal of an NMOS transistor of the 500-th transmission gate T500 and a gate terminal of a PMOS transistor of the 501-th transmission gate T501. The output unit 500 further includes a 500-th inverter I500 for inverting the output from the transmission control unit 400. The second output transmitting unit includes a 500-th NOR gate AD500 for logically NORing the chip select signal /CS and the output from the 500-th or 501-th transmission gate T500 or T501, a 500-th NAND gate ND500 for logically NANDing the chip select signal /CS and the 500-th or 501-th transmission gate T500 or T501, a 504-th inverter I504 for inverting the output from the 500-th NOR gate AD500, a 505-th inverter I505 for inverting the output from the 500-th NAND gate ND500, a 500-th PMOS transistor P500 connected in series between a power voltage and a ground voltage, for generating the logic high wait signal Wait according to the output from the 504-th inverter I504, and a 500-th NMOS transistor N500 for generating the logic low wait signal Wait according to the output from the 505-th inverter I505. The output state control signal Wctl determines whether to enable the wait signal to logic high or logic low in a data input or output state.

The operation of the circuit for generating the wait signal in accordance with the present invention will now be described.

Figure 6:
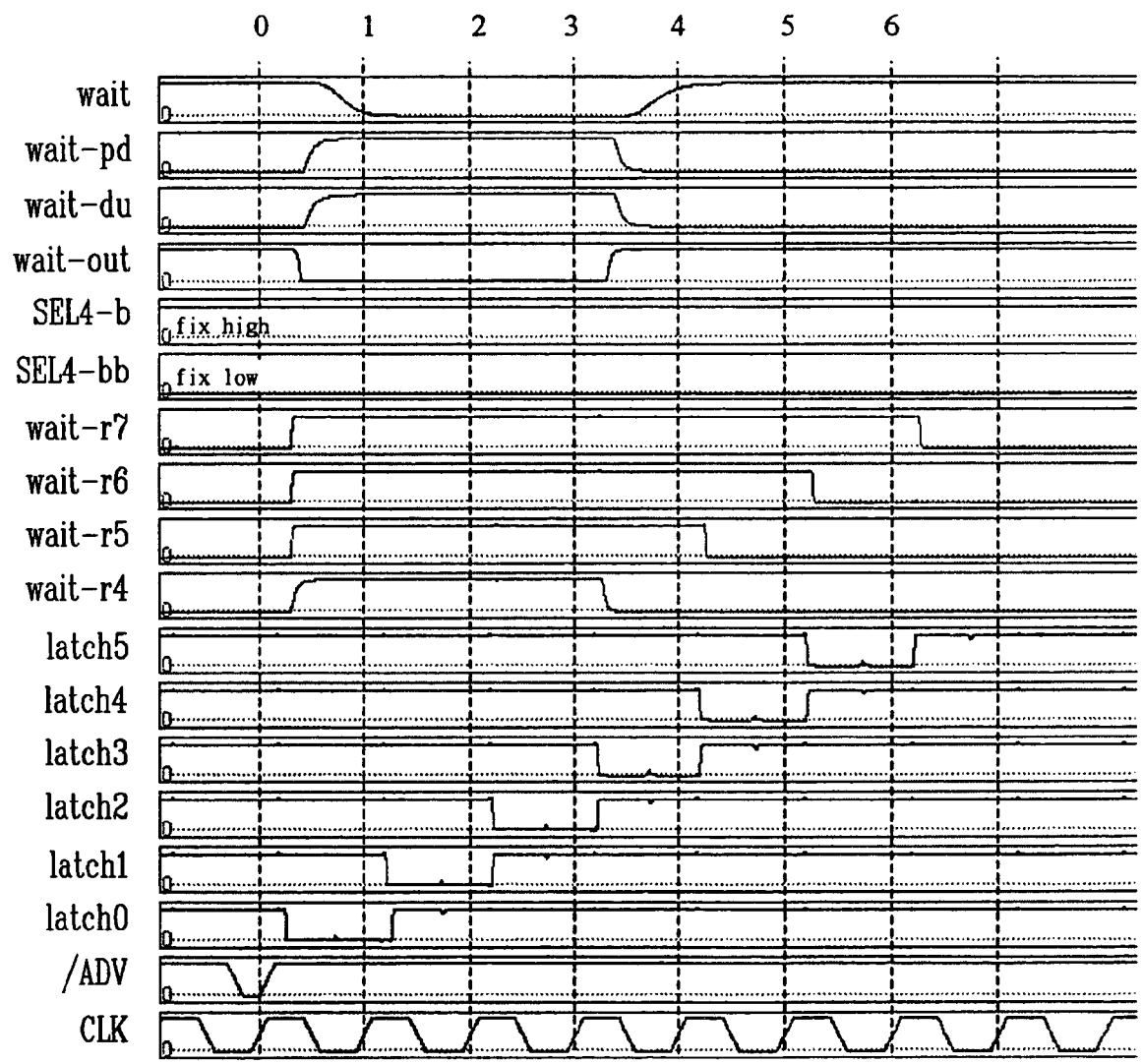
FIG. 6 is a waveform diagram showing outputs from each unit in accordance with the present invention.
Figure 7:
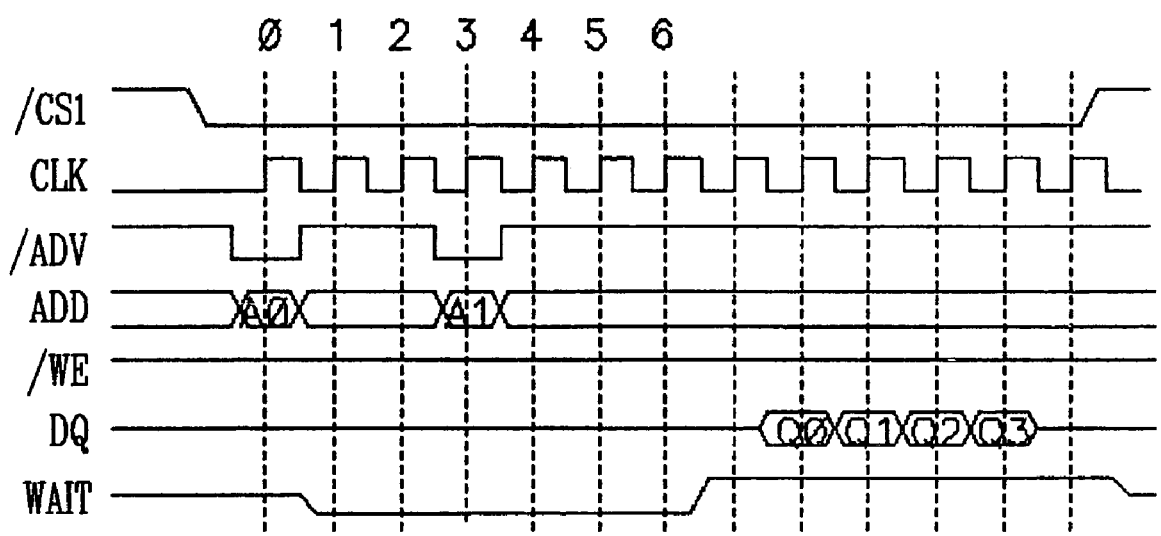
FIG. 7 is a waveform diagram showing a data input or output operation of the semiconductor device in accordance with the present invention.

FIG. 6 is a waveform diagram showing outputs from each unit in accordance with the present invention, and FIG. 7 is a waveform diagram showing a data input or output operation of the semiconductor device in accordance with the present invention.

As illustrated in FIGS. 2 to 7, when a voltage is initially applied to the semiconductor device, the power-up signal PWRUP maintains logic low for a predetermined time and becomes logic high. The logic state of the power-up signal PWRUP is changed according to the state of the applied voltage. When the power-up signal PWRUP is logic low, the shift latch units 110 to 170 of the latch unit 100 are initialized. That is, the latch nodes and the output signals of the shift latch units 110 to 170 are initialized in a logic low state. Thereafter, the logic state of the power-up signal PWRUP is changed, to operate the latch unit 100.

The latch unit 100 generates the first to seventh latch signals latch0 to latch6 by synchronizing the address input enable signal ADV with the clock, and shifting the signal by one clock in every clock. That is, when the logic low address input enable signal ADV is synchronized with a first clock signal and applied, the first latch signal latch0 is logic low for a second clock signal. In addition, the second to seventh latch signals latch1 to latch6 become logic low for third to eighth clocks. The first to eighth clocks are sequentially-inputted clock signals.

The wait signal generating unit 200 generates the first to fourth wait signals wait-r4 to wait-r7 having various latency counters and the same pulse width according to the first to seventh latch signals latch0 to latch6. That is, the wait signal generating unit 200 generates the first wait signal wait-r4 maintaining logic high for three clocks by using the fourth latch signal latch3 and the inverted first to third latch signals latch0b to latch2b. In addition, the wait signal generating unit 200 generates the second wait signal wait-r5 maintaining logic high for four clocks by using the fifth latch signal latch4 and the inverted first to fourth latch signals latch0b to latch3b, generates the third wait signal wait-r6 maintaining logic high for five clocks by using the sixth latch signal latch5 and the inverted first to fifth latch signals latch0b to latch4b, and generates the fourth wait signal wait-r7 maintaining logic high for six clocks by using the seventh latch signal latch6 and the inverted first to sixth latch signals latch0b to latch5b.

On the other hand, the latency counter selecting unit 300 generates the first to fourth previous select signals SEL4-b to SEL7-b and the first to fourth same select signals SEL4-s to SEL7-s according to the first to fourth latency counter signals LC4 to LC7 and the wait output control signal Wout-CS for determining the latency counter and the enable time of the wait signal. That is, in order to transmit the wait signal enabled earlier than data input or output by one clock when the latency counter is 4, the logic high wait output control signal Wout-CS and the first latency counter signal LC4 are applied, and the second to fourth latency counter signals LC5 to LC7 are set logic low. Therefore, the first previous select signal SEL4-b becomes logic high, and the other signals become logic low. In order to transmit the wait signal enabled simultaneously with data input or output when the latency counter is 6, the logic low wait output control signal Wout-CS and the logic high third latency counter signal LC6 are applied. Accordingly, only the third same select signal SEL6-s becomes logic high.

The transmission control unit 400 transmits only one of the first to fourth wait signals Wait-r4 to Wait-r7 generated in the wait signal generating unit 200 according to the plurality of select signals SEL generated in the latency counter selecting unit 300. That is, only the transmission gate receiving the logic high first previous select signal SEL4-b is turned on, to transmit the first wait signal Wait-r4 enabled earlier than data input or output by one clock when the latency counter is 4.

The output unit 500 determines the logic state of the wait signal Wait-out from the transmission control unit 400 and outputs the wait signal Wait-out according to the output state control signal Wctl and the chip select signal /CS. For example, it is presumed that the logic high output state control signal Wctl is applied. As described above, because the wait signal which is the output from the transmission control unit 400 maintains logic low for a predetermined time, the output from the 505-th inverter I505 becomes logic high, and the wait signal Wait-out becomes logic low for a predetermined clock. When the wait signal Wait-out which is the output from the transmission control unit 400 becomes logic high after the latency counter, the output from the 504-th inverter I504 becomes logic low, and thus the wait signal Wait becomes logic low. In addition, it is presumed that the logic low output state control signal Wctl is applied. The output from the 504-th inverter I504 becomes logic low by the logic low wait signal Wait-out for a predetermined clock, and thus the wait signal Wait maintains logic high for a predetermined clock. When the wait signal Wait-out becomes logic high after the latency counter, the output from the 505-th inverter I505 becomes logic high, and thus the wait signal Wait becomes logic high.

As described above, in the circuit for generating the wait signal, even if the inverted address input enable signal /ADV is synchronized with the clock and continuously or irregularly inputted, the latch unit 100 and the wait signal generating unit 200 are operated according to the last inverted address input enable signal /ADV, to generate the object wait signal Wait. It is presumed that the logic low address input enable signal ADV is synchronized with the clock and continuously inputted. The first shift latch unit 110 continuously generates the logic low first latch signal latch0, and thus the entire outputs from the wait signal generating unit 200 always maintain logic high. Accordingly, the transmission control unit 400 always outputs the logic low wait signal Wait-out regardless of the select signal of the latency counter selecting unit 300, and thus the output unit 500 continuously outputs the logic low wait signal Wait. However, when the address input enable signal ADV is the last input value, the wait signal Wait is transited into logic high after a predetermined latency counter.

FIG. 7 shows a state where the latency counter is 4. When a first address input enable signal /ADV and an address A0 are synchronized with a first clock and inputted, a wait signal WAIT maintains a logic low state to be suitable for the latency counter. Here, when a second address input enable signal /ADV and an address A1 are synchronized with a fourth clock and inputted, the wait signal WAIT maintains a logic low state to be suitable for the latency counter. Input/output data Q0, Q1, Q2 and Q3 are inputted after three clocks from input of the second address input enable signal /ADV. In the conventional arts, the wait signal WAIT automatically becomes logic high after three clocks from input of the first address input enable signal /ADV, regardless of the second address input enable signal /ADV. In accordance with the present invention, after the first address input enable signal /ADV is inputted, if the second address input enable signal /ADV is not inputted, the wait signal WAIT becomes logic high after three clocks as in the conventional arts. However, after the first address input enable signal /ADV is inputted, if the second address input enable signal /ADV is inputted, the wait signal WAIT becomes logic high after three clocks from input of the second address input enable signal /ADV.

As discussed earlier, in accordance with the present invention, even if the address input enable signal is synchronized with the clock and continuously or irregularly inputted, the circuit for generating the wait signal in the semiconductor device can generate the wait signal suitable for the latency counter by using the finally-inputted address input enable signal.

In addition, the circuit for generating the wait signal in the semiconductor device can generate the wait signals having various pulse widths to be suitable for various latency counters.

Furthermore, the circuit for generating the wait signal in the semiconductor device enables the object wait signal earlier than data input or output by one clock, or simultaneously with data input or output.

The circuit for generating the wait signal in the semiconductor device can also transit the enable state of the wait signal used in the device into logic low or logic high.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for generating a wait signal in a semiconductor device, comprising:
    a latch unit for sequentially generating a plurality of latch signals by shifting an address input enable signal in every clock;
    a wait signal generating unit for generating a plurality of wait signals corresponding to latency counter values according to the plurality of latch signals;
    a wait signal selecting and transmitting unit for outputting the wait signal corresponding to the target latency counter value among the plurality of wait signals according to a plurality of latency counter signals and a wait output control signal; and
    an output unit for determining a logic state of the wait signal and outputting the wait signal according to an output state control signal and a chip select signal.

2. The circuit of claim 1, wherein the latch unit comprises:
    a first shift latch unit driven by a power-up signal, for transmitting a first latch signal synchronized with a clock and a first output signal according to the address input enable signal and the clock signal;
    a second shift latch unit for transmitting a second latch signal obtained by shifting the first latch signal and a second output signal according to the power-up signal, the first output signal and the clock signal;
    a third shift latch unit for transmitting a third latch signal obtained by shifting the second latch signal and a third output signal according to the power-up signal, the second output signal and the clock signal:
    a fourth shift latch unit for transmitting a fourth latch signal obtained by shifting the third latch signal and a fourth output signal according to the power-up signal, the third output signal and the clock signal;
    a fifth shift latch unit for transmitting a fifth latch signal obtained by shifting the fourth latch signal and a fifth output signal according to the power-up signal, the fourth output signal and the clock signal;
    a sixth shift latch unit for transmitting a sixth latch signal obtained by shifting the fifth latch signal and a sixth output signal according to the power-up signal, the fifth output signal and the clock signal; and
    a seventh shift latch unit for transmitting a seventh latch signal obtained by shifting the sixth latch signal and a seventh output signal according to the power-up signal, the sixth output signal and the clock signal.

3. The circuit of claim 2, wherein each of the first to seventh shift latch units comprises:
    a first transmission gate for transmitting the inverted address input enable signal or the first to sixth output signals according to the clock signal;
    a first latch for outputting the first to seventh latch signals by latching the outputs from the first transmission gate;

a first inverter for inverting the first to seventh latch signals;

a second transmission gate for transmitting the inverted first to seventh latch signals according to the clock signal;

a second latch for latching the outputs from the second transmission gate; and a second inverter for inverting the outputs from the second latch, and transmitting the first to seventh output signals.

4. The circuit of claim 3, further comprising first and second NMOS transistors for initializing the first and second latches according to the inverted power-up signal.

5. The circuit of claim 1, wherein the wait signal generating unit comprises:

a first wait signal logic combination unit for generating a first wait signal maintaining a predetermined logic state for a smaller clock than a minimum latency counter by one clock by logic combination of the latch signals;

a second wait signal logic combination unit for generating a second wait signal maintaining a predetermined logic state longer than the first wait signal by one clock by logic combination of the latch signals;

a third wait signal logic combination unit for generating a third wait signal maintaining a predetermined logic state longer than the second wait signal by one clock by logic combination of the latch signals; and a fourth wait signal logic combination unit for generating a fourth wait signal maintaining a predetermined logic state longer than the third wait signal by one clock by logic combination of the latch signals.

6. The circuit of claim 5, wherein the first wait signal maintains a predetermined logic state for three clocks, the second wait signal maintains a predetermined logic state for four clocks, the third wait signal maintains a predetermined logic state for five clocks, and the fourth wait signal maintains a predetermined logic state for six clocks.

7. The circuit of claim 5, wherein each of the first to fourth wait signal logic combination units comprises:

a first NOR gate for receiving first to third input signals:

a second NOR gate for receiving fourth to sixth input signals;

a first NAND gate for receiving the outputs from the first and second NOR gates;

a third NOR gate for receiving a seventh input signal and the output from the first NAND gate;

a fourth NOR gate for receiving the seventh input signal and the output from the first NAND gate; and a fifth NOR gate for receiving the outputs from the third and fourth NOR gates, and outputting the wait signal.

8. The circuit of claim 7, wherein the first wait signal logic combination unit receives the inverted first to third latch signals and the fourth latch signal, the second wait signal logic combination unit receives the inverted first to fourth latch signals and the fifth latch signal, the third wait signal logic combination unit receives the inverted first to fifth latch signals and the sixth latch signal, and the fourth wait signal logic combination unit receives the inverted first to sixth latch signals and the seventh latch signal.

9. The circuit of claim 1, wherein the wait signal selecting and transmitting unit comprises:

a latency counter selecting unit for generating a select signal for selecting the wait signal corresponding to the target latency counter according to the plurality of latency counter signals and the wait output control signal for determining the target latency counter and the enable time of the wait signal; and a transmission control unit for transmitting the wait signal corresponding to the target latency counter according to the select signal.

10. The circuit of claim 9, wherein the latency counter selecting unit comprises first to fourth select signal output units for transmitting a plurality of select signals for selecting the wait signal corresponding to the target latency counter according to the wait output control signal and the first to fourth latency counter signals, and determining whether to enable the wait signal simultaneously with data input or output, or before one clock from data input or output.

11. The circuit of claim 10, wherein each of the first to fourth select signal output units comprises:

a first NAND gate for logically NANDing the inverted wait output control signal and the first to fourth latency counter signals;

a second inverter for inverting the outputs from the first NAND gate, and transmitting first to fourth previous select signals;

a second NAND gate for logically NANDing the wait output control signal and the first to fourth latency counter signals; and a third inverter for inverting the outputs from the second NAND gate, and transmitting first to fourth same select signals.

12. The circuit of claim 9, wherein the transmission control unit comprises:

a first transmission gate for transmitting the first wait signal according to the first previous select signal;

second and third transmission gates for transmitting the second wait signal according to the first same select signal and the second previous select signal, respectively;

fourth and fifth transmission gates for transmitting the third wait signal according to the second same select signal and the third previous select signal, respectively; and sixth and seventh transmission gates for transmitting the fourth wait signal according to the third same select signal and the fourth previous select signal, respectively.

13. The circuit of claim 1, wherein the output unit comprises:

a first output transmitting unit for transmitting the wait signal or an inverted signal of the wait signal according to the output state control signal for determining whether to enable the wait signal to logic high or logic low in the data input or output state; and a second output transmitting unit for determining a logic state of the wait signal and outputting the wait signal according to the output from the first output transmitting unit and the chip select signal.

14. The circuit of claim 13, wherein the first output transmitting unit comprises:

a first inverter for inverting the wait signal;

a first transmission gate for transmitting the inverted wait signal according to the output state control signal; and a second transmission gate for transmitting the wait signal according to the output state control signal, wherein the output state control signal is applied to a gate terminal of a PMOS transistor of the first transmission gate and a gate terminal of an NMOS transistor of the second transmission gate, and the inverted output state control signal is applied to a gate terminal of an NMOS transistor of the first transmission gate and a gate terminal of a PMOS transistor of the second transmission gate.

15. The circuit of claim 13, wherein the second output transmitting unit comprises:
- a first NOR gate for logically NORing the chip select signal and the output from the first or second transmission gate;
- a first NAND gate for logically NANDing the chip select signal and the output from the first or second transmission gate;
- a second inverter for inverting the output from the first NOR gate;
- a third inverter for inverting the output from the first NAND gate; and
- a PMOS transistor connected in series between a power voltage and a ground voltage, for generating the logic high wait signal according to the output from the fourth inverter, and an NMOS transistor for generating the logic low wait signal according to the output from the third inverter.

* * * * *